United States Patent
Yamakoshi et al.

(10) Patent No.: US 9,249,497 B2
(45) Date of Patent: Feb. 2, 2016

(54) NI ALLOY SPUTTERING TARGET, NI ALLOY THIN FILM AND NI SILICIDE FILM

(75) Inventors: Yasuhiro Yamakoshi, Ibaraki (JP); Kazumasa Ohashi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 237 days.

(21) Appl. No.: 13/635,775

(22) PCT Filed: Mar. 18, 2011

(86) PCT No.: PCT/JP2011/056589
§ 371 (c)(1),
(2), (4) Date: Oct. 19, 2012

(87) PCT Pub. No.: WO2011/115259
PCT Pub. Date: Sep. 22, 2011

(65) Prior Publication Data
US 2013/0032477 A1    Feb. 7, 2013

(30) Foreign Application Priority Data

Mar. 19, 2010  (JP) .................... 2010-064839

(51) Int. Cl.
| | |
|---|---|
| C23C 14/16 | (2006.01) |
| C22C 19/05 | (2006.01) |
| C22C 19/03 | (2006.01) |
| C23C 14/34 | (2006.01) |
| C22C 5/04 | (2006.01) |

(52) U.S. Cl.
CPC ............ *C23C 14/3414* (2013.01); *C22C 5/04* (2013.01); *C22C 19/03* (2013.01)

(58) Field of Classification Search
CPC ...... C23C 14/16; C23C 14/3414; C22C 5/04; C22C 19/03; C22C 19/00
See application file for complete search history.

(56) References Cited

U.S. PATENT DOCUMENTS

| | | | |
|---|---|---|---|
| 5,302,552 A | 4/1994 | Duchateau et al. | |
| 5,460,793 A | 10/1995 | Kano et al. | |
| 5,618,397 A | 4/1997 | Kano et al. | |
| 5,840,626 A | 11/1998 | Ohguro | |

(Continued)

FOREIGN PATENT DOCUMENTS

| | | |
|---|---|---|
| JP | S63-033563 A | 2/1988 |
| JP | 05-247642 A | 9/1993 |

(Continued)

OTHER PUBLICATIONS

L.E. Terry et al., "Schottky Barrier Heights of Nickel-Platinum Silicide Contacts on n-Type Si", Applied Physics Letters, vol. 28, No. 4, pp. 229-231, Feb. 1976.*

*Primary Examiner* — Jessee Roe
(74) *Attorney, Agent, or Firm* — Howson & Howson LLP

(57) ABSTRACT

Provided is a Ni alloy sputtering target containing Pt in an amount of 5 to 30 at %, and one or more components selected from V, Al, Cr, Ti, Mo, and Si in a total amount of 1 to 5 at %, wherein the remainder is Ni and unavoidable impurities. The present invention is able to increase the low pass-through flux (PTF), which is a drawback of a Ni—Pt alloy having high magnetic permeability, increase the erosion area of the target which tends to be small as a result of the magnetic field lines being locally concentrated on the surface of the target during sputtering, and inhibit the difference between the portion where erosion is selectively advanced and the portion where erosion does not advance as much as the erosion progresses.

7 Claims, 1 Drawing Sheet

(56) References Cited

U.S. PATENT DOCUMENTS

| | | |
|---|---|---|
| 5,989,988 A | 11/1999 | Iinuma et al. |
| 6,159,625 A | 12/2000 | Ueno |
| 6,423,196 B1 | 7/2002 | Ivanvov |
| 6,780,295 B2 | 8/2004 | Ivanvov |
| 7,311,981 B2 | 12/2007 | Saint Ramond et al. |
| 7,605,481 B2 | 10/2009 | Yamakoshi et al. |
| 7,618,505 B2 | 11/2009 | Yamakoshi et al. |
| 7,740,718 B2 | 6/2010 | Yamakoshi et al. |
| 7,959,782 B2 | 6/2011 | Shindo |
| 8,114,341 B2 | 2/2012 | Yamakoshi |
| 8,679,973 B2 | 3/2014 | Akiyama et al. |
| 2003/0228238 A1 | 12/2003 | Zhang et al. |
| 2004/0256035 A1 | 12/2004 | Yamakoshi et al. |
| 2005/0183797 A1 | 8/2005 | Ray |
| 2006/0037680 A1 | 2/2006 | Yamakoshi |
| 2007/0098590 A1 | 5/2007 | Shindo |
| 2008/0090369 A1 | 4/2008 | Akiyama et al. |
| 2008/0131735 A1* | 6/2008 | Das et al. ............. 428/831 |
| 2009/0028744 A1 | 1/2009 | Hui et al. |
| 2009/0075477 A1 | 3/2009 | Kawamura et al. |
| 2012/0098131 A1 | 4/2012 | Yamakoshi |

FOREIGN PATENT DOCUMENTS

| | | |
|---|---|---|
| JP | 07-038104 A | 2/1995 |
| JP | 08-067972 A | 3/1996 |
| JP | 08-144053 A | 6/1996 |
| JP | 08-144054 A | 6/1996 |
| JP | 08-144055 A | 6/1996 |
| JP | 10-251848 A | 9/1998 |
| JP | 2003-213405 A | 7/2003 |
| JP | 2003-213407 A | 7/2003 |
| JP | 2005-171341 A | 6/2005 |
| JP | 2009-167530 A | 7/2009 |
| WO | 03/062488 A1 | 7/2003 |

* cited by examiner

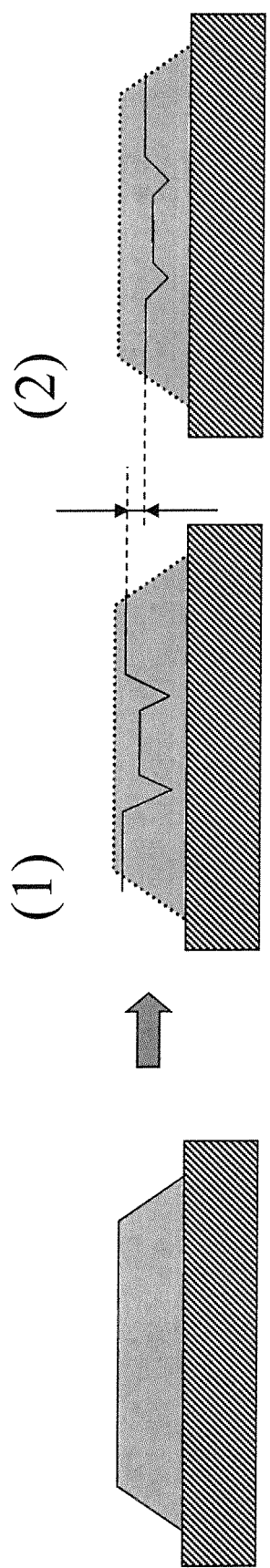

NI ALLOY SPUTTERING TARGET, NI ALLOY THIN FILM AND NI SILICIDE FILM

TECHNICAL FIELD

The present invention relates to a target capable of reducing the difference to the minimum between the portion where erosion is selectively advanced and the portion where erosion does not advance as much as the erosion progresses so as to reduce the variation in the thickness of the target, and consequently prolong the target life and increase the usability.

Moreover, the present invention relates to a Ni alloy sputtering target which enables the formation of a thermally stable nickel silicide (NiSi) film, has favorable plastic workability, and which is particularly effective in the manufacture of a gate electrode material (thin film), as well as to a Ni silicide film that is formed based on the reaction between a silicon substrate and the Ni alloy thin film.

BACKGROUND ART

In recent years, the use of a NiSi film in the salicide process as the gate electrode material is attracting attention. Compared to cobalt, nickel is characterized in that it is capable of forming a silicide film with less consumption of silicon in the salicide process. NiSi, as with a cobalt silicide film, is characterized in that the increase of fine wire resistance pursuant to the refinement of wiring is unlikely to occur.

In light of the above, nickel is being used instead of cobalt, which is expensive, as the gate electrode material. Nevertheless, NiSi tends to make a phase change to the more stable phase of $NiSi_2$, and there is a problem of the degradation of the boundary roughness and increase in the resistance. And, there are other problems in that the clumping of the film and excessive formation of silicides may occur.

Conventionally, as a technique of using a Ni silicide film or the like, there is technology of capping and annealing a metal compound film made of TiN or the like on a Ni or Co film to prevent the formation of an insulation film as a result of reacting with oxygen upon forming the silicide film. Here, TiN is used to prevent the formation of an irregular insulation film caused by the reaction of oxygen and Ni.

If the irregularities are small, since the length from the NiSi film to the connection of the source/drain diffusion layer will be long, it is said that the junction leak can be suppressed. In addition, TiC, TiW, TiB, $WB_2$, WC, BN, AlN, $Mg_3N_2$, CaN, $Ge_3N_4$, TaN, $TbNi_2$, $VB_2$, VC, ZrN, ZrB and the like are also disclosed as the cap film (refer to Patent Document 1).

Further, with conventional technology, problems have been indicated in that the NiSi formed on the substrate is easily oxidized among the silicide materials, large irregularities are formed on the boundary area of the NiSi film and the Si substrate, and a junction leak will occur.

Here, a proposal has been made for sputtering a TiN film as a cap film on the Ni film, and subjecting this to heat treatment so as to nitride the surface of the NiSi film. This aims to prevent the NiSi from oxidizing, and suppress the formation of irregularities. Nevertheless, since the nitride film on the NiSi formed by accumulating TiN on Ni is thin, there is a problem in that it is difficult to maintain the barrier properties for a long period of time.

Thus, a proposal has been made of forming the silicide film under a mixed gas (2.5 to 10%) atmosphere with nitrogen gas added thereto so that the roughness of the silicide film will be 40 nm or less, and the grain size will be 200 nm or more. Here, it is desirable to cap one among Ti, W, TiNx and WNx on Ni.

Here, it is also possible to sputter Ni with only argon gas that does not contain nitrogen gas, subsequently sputter the cap film made of TiN, and thereafter inject N ions into the Ni film in order to add N in the Ni film (refer to Patent Document 2).

As conventional technology, a semiconductor device and its manufacturing method are disclosed, and the combination of primary metals of Co, Ni, Pt or Pd and secondary metals of Ti, Zr, Hf, V, Nb, Ta or Cr is described. In the Examples, the Co—Ti combination is used.

Cobalt has a lower capability of reducing the silicon oxide film in comparison to titanium, and the silicide reaction will be inhibited if there is a natural oxide film existing on the silicon substrate or the polysilicon film surface upon accumulating cobalt. The heat resistance properties are inferior to a titanium silicide film, and problems have been indicated in that the heat upon accumulating the silicon oxide film as the interlayer film after the completion of the salicide process causes the clumping of the cobalt disilicide ($CoSi_2$) film and the resistance to increase (refer to Patent Document 3).

Further, as conventional technology, there is disclosure of a "manufacturing method of a semiconductor device", and technology is described where an amorphous alloy layer with a metal selected from a group consisting of titanium, zirconium, tantalum, molybdenum, niobium, hafnium, and tungsten is deposited on a surface as a layer containing cobalt Co or nickel Ni in order to prevent the short-circuit caused by the overgrowth upon forming salicide. Here, although there are Examples that show a cobalt content of 50 to 75 at % and Ni 40/Zr 60, the alloy content is large for achieving an amorphous layer (refer to Patent Document 4).

The disclosed conventional technologies described above relate to the deposition process, and do not relate to a sputtering target. Further, with the conventional high purity nickel, the purity was roughly up to 4N excluding gas components, and the oxygen content was high at roughly 100 ppm. As a result of manufacturing a Ni alloy target based on this kind of conventional nickel, plastic workability was inferior and it was not possible to manufacture a high quality target. Also, there was a problem in that numerous particles were generated during sputtering, and the uniformity was inferior.

In light of the foregoing problems of the gate electrode material, the present Applicant developed a nickel-based sputtering target material doped with titanium or platinum as a particularly superior material, and proposed the inhibition of the phase change to the stable phase of $NiSi_2$ (refer to Patent Document 5, Patent Document 6, Patent Document 7, and Patent Document 8).

Among the foregoing proposals, platinum-doped Ni alloy was the most effective, and had high effect at the time it was proposed. However, in recent years, reduction in the wiring width and increase in the processing temperature are becoming unavoidable, and thermal stability at even higher temperatures is being demanded. The Patent Document 8 improved the foregoing point and comprises the characteristic features of this point, and it can be said that the characteristics and usefulness of the Pt-doped Ni alloy of Patent Document 8 are exceptional.

Meanwhile, a platinum-doped Ni alloy (Ni—Pt alloy) entails the following problems; namely, platinum is expensive, and, when used as a sputtering target, the sputtering characteristics are inferior since it possesses high magnetic permeability. Since a target with magnetic permeability has a low pass-through flux (PTF), magnetic field lines are locally concentrated on the surface of the target during sputtering and the erosion area of the target tends to be small.

Thus, as the erosion progresses, the difference between the portion where erosion is selectively advanced and the portion where erosion does not advance as much will increase. Then, the variance in the thickness of the target will arise. Since the most eroded portion becomes the duration of life of the target, there is a problem in that the usability will considerably deteriorate. Moreover, since the changes in the shape of the eroded portion will become remarkable, there is a possibility that the uniformity of the sputtered film will also be affected. Thus, as a Ni alloy target that is effective in forming a Ni silicide film, demanded is a material with the lowest possible magnetic permeability; that is, with a high pass-through flux (PTF).

Nickel is a typical material with high magnetic permeability, and the magnetic permeability will decrease slightly as a result of adding platinum to nickel. Nevertheless, it cannot be said that this is a material with the lowest possible magnetic permeability and a high pass-through flux (PTF) as the Ni alloy target as described above.

In addition to foregoing Patent Documents 1 to 8, as conventional technology, there are other documents such as the following Patent Documents 9 to 17 which describe technologies based on a Ni alloy. For example, Patent Document 9 describes a Pt—Ni alloy target, Patent Documents 10 to 13 describe a nickel silicide sintered compact target, Patent Document 14 describes a Ni alloy target in which silicon is solutionized, Patent Document 15 describes a Ni—Si alloy target, Patent Document 16 describes a high purity Ni alloy target, and Patent Document 17 describes a Ti—Cu—Ni alloy target, but none of these documents are able to resolve the foregoing problems to obtain a nickel-platinum alloy having superior characteristics.

[Patent Document 1] Japanese Unexamined Patent Application Publication No. H7-38104
[Patent Document 2] Japanese Unexamined Patent Application Publication No. H9-153616
[Patent Document 3] Japanese Unexamined Patent Application Publication No. H11-204791 (U.S. Pat. No. 5,989,988)
[Patent Document 4] Japanese Unexamined Patent Application Publication No. H5-94966
[Patent Document 5] Japanese Unexamined Patent Application Publication No. 2003-213405
[Patent Document 6] Japanese Unexamined Patent Application Publication No. 2003-213406
[Patent Document 7] WO2005-083138
[Patent Document 8] Japanese Unexamined Patent Application Publication No. 2009-167530
[Patent Document 9] Japanese Unexamined Patent Application Publication No. S63-335563
[Patent Document 10] Japanese Unexamined Patent Application Publication No. H8-144053
[Patent Document 11] Japanese Unexamined Patent Application Publication No. H8-144054
[Patent Document 12] Japanese Unexamined Patent Application Publication No. H8-144055
[Patent Document 13] Japanese Unexamined Patent Application Publication No. H8-67972
[Patent Document 14] Japanese Unexamined Patent Application Publication No. H10-251848
[Patent Document 15] Japanese Unexamined Patent Application Publication, Translation of PCT Application No. 2001-523767
[Patent Document 16] Japanese Unexamined Patent Application Publication No. 2003-213407
[Patent Document 17] Japanese Unexamined Patent Application Publication No. 2005-171341

SUMMARY OF THE INVENTION

Problems to be Solved by the Invention

An object of this invention is to increase the low pass-through flux (PTF), which is a drawback of a Ni—Pt alloy having high magnetic permeability, increase the erosion area of the target which tends to be small as a result of the magnetic field lines being locally concentrated on the surface of the target during sputtering, and inhibit the difference between the portion where erosion is selectively advanced and the portion where erosion does not advance as much as the erosion progresses.

Specifically, an object of this invention is to provide a Ni alloy sputtering target capable of forming a thermally stable silicide (NiSi) film, which is particularly effective in manufacturing a gate electrode material (thin film) in which the clumping of the film or excessive silicidation does not occur easily, has low particle generation upon forming the sputtered film, and has favorable uniformity, as well as to a Ni alloy thin film and a Ni silicide film formed from the foregoing target.

Means for Solving the Problems

In order to achieve the foregoing object, the present invention discovered that it is possible to reduce the difference to the minimum between the portion where erosion is selectively advanced and the portion where erosion does not advance as much as the erosion progresses so as to reduce the variation in the thickness of the target, and consequently prolong the target life and increase the usability. The present invention additionally discovered that it is possible to obtain a Ni silicide film capable of thermally stable silicide (NiSi) deposition, which has low particle generation during sputtering and favorable uniformity, capable of facilitating the sputtering process by lowering the magnetic permeability and increasing the pass-through flux (PTF), and additionally capable of inhibiting the phase change from NiSi to $NiSi_2$ based on the deposition using the foregoing target.

Based on the foregoing discovery, the present invention provides:
1) A Ni alloy sputtering target containing Pt in an amount of 5 to 30 at %, and one or more components selected from V, Al, Cr, Ti, Mo, and Si in a total amount of 1 to 5 at %, wherein the remainder is Ni and unavoidable impurities.
The present invention additionally provides:
2) A Ni alloy thin film having a composition containing Pt in an amount of 5 to 30 at %, one or more components selected from V, Al, Cr, Ti, Mo, and Si in a total amount of 1 to 5 at %, and the remainder being Ni and unavoidable impurities, wherein the Ni alloy thin film is deposited by a sputtering method.
Moreover, the present invention also provides:
3) A Ni silicide film formed by sputtering a Ni alloy sputtering target containing Pt in an amount of 5 to 30 at % and one or more components selected from V, Al, Cr, Ti, Mo, and Si in a total amount of 1 to 5 at %, and in which the remainder is Ni and unavoidable impurities, and thereby forming a Ni alloy film on a silicon substrate, wherein the Ni silicide film is formed based on a reaction of the Ni alloy film and the silicon substrate.

Effect of the Invention

In order to overcome the foregoing problems, as a result of adding the foregoing metal elements, together with platinum, to high purity nickel, thermally stable silicide (NiSi) deposition is enabled, and the effects of being able to reduce the generation of particles during sputtering and achieving favorable uniformity are yielded.

Moreover, as a result of reducing the addition of expensive platinum to the minimum in cases of using platinum-doped Ni alloy (Ni—Pt alloy) and insistently maintaining the characteristics of a Ni—Pt alloy, reducing the magnetic permeability, and increasing the pass-through flux (PTF), significant effects are yielded in that it is possible to inhibit the magnetic field lines from becoming locally concentrated on the surface of the target during sputtering, and increase, as much as possible, the erosion area of the target.

Consequently, the target of the present invention yields of effects of being able to reduce the difference to the minimum between the portion where erosion is selectively advanced and the portion where erosion does not advance as much as the erosion progresses so as to reduce the variation in the thickness of the target, and consequently prolong the target life and increase the usability. Moreover, an effect is yielded in that the uniformity of the sputtered film is improved since it is possible to prevent the changes in the shape of the eroded portion from becoming remarkable. The present invention comprehensively yields the foregoing results, and additionally yields a significant effect of being able to obtain a Ni silicide film capable of inhibiting the phase change from NiSi to $NiSi_2$ due to the deposition using the foregoing target.

BRIEF DESCRIPTION OF THE DRAWINGS

FIG. 1 is a diagram showing the outline of the erosion profile when a target is sputtering up to a life of 100 kWh.

DETAILED DESCRIPTION OF THE INVENTION

The target of the present invention is obtained by subjecting crude Ni (up to roughly 4N) to electrolytic refining so as to eliminate the metal impurity components, thereafter performing EB melting and refining thereto to obtain a high purity nickel ingot, adding high purity platinum and one or more components selected from high purity V, Al, Cr, Ti, Mo, and Si in an amount of 1 to 5 at % to the obtained ingot, and subjecting this to vacuum melting so as to prepare a high purity Ni alloy ingot.

While it is possible to not restrict the amount of impurities, the existence of impurities alone affect the film quality of the deposited Ni alloy thin film, and it can be said that the purity level should be maintained as much as possible. Upon performing vacuum melting, a cold crucible melting method using a water-cooled copper crucible is preferably adopted. This alloy ingot is formed into a plate-like shape via processes such as forging and rolling, and this is subject to heat treatment at a temperature between the recrystallization temperature of approximately 500° C. and 950° C. so as to ultimately prepare a target.

The target of the present invention comprising the foregoing composition is able to reduce the difference to the minimum between the portion where erosion is selectively advanced and the portion where erosion does not advance as much, and it is thereby possible to reduce the variation in the thickness of the target, and hence, prolong the target life and increase the usability. Thus, since it is possible to prevent the changes in the shape of the eroded portion from becoming remarkable, an effect is yielded in that the uniformity of the sputtered film is improved. The foregoing additive elements yield this kind of comprehensive effect.

Moreover, the additive amount of platinum (Pt) is 5 to 30 at %, and if the additive amount of platinum is too small, the thermal stability of the Ni alloy layer at a high temperature will not improve. Meanwhile, if the additive amount is too much, not only will the film resistance become too great and inappropriate, the amount of intermetallic compounds will become too great and plastic working will become difficult; and there is a problem in that the generation of particles will increase during sputtering. The foregoing numerical values are the lower limit and the upper limit for maintaining the characteristics.

In addition, the present invention contains one or more components selected from V, Al, Cr, Ti, Mo, and Si in a (total) amount of 1 to 5 at %. These additive elements exist in a solutionized state in Ni. This addition is significant, and these alloy elements play an important role in reducing the magnetic permeability of the Ni—Pt alloy, and increasing the pass-through flux (PTF). These alloy elements yield a significant effect of being able to inhibit the magnetic field lines from becoming locally concentrated on the surface of the target during sputtering, and increase the erosion area of the target as much as possible.

An effect of further improving the thermal stability of the Ni alloy layer at a high temperature is yielded; as described, as a result of adding platinum (Pt) in an additive amount of 5 to 30 at %, preferably, in an amount of more than 5 at % and less than 20 at % and additionally containing one or more components selected from V, Al, Cr, Ti, Mo, and Si in a (total) amount of 1 to 5 at %.

If the additive amount of the one or more components selected from V, Al, Cr, Ti, Mo, and Si is less than 1 at %, no effect is yielded. And if the additive amount exceeds 5 at %, there is a possibility that the characteristics as a Ni—Pt alloy will deteriorate. Thus, the additive amount is kept within the foregoing range.

Specifically, with the foregoing additive amount, the addition of alloy elements will not deteriorate the characteristics of the Ni alloy thin film. In addition, as a result of adding the foregoing alloy elements, in comparison to adding Pt independently, there is an additional effect of being able to effectively inhibit the phase change from NiSi to $NiSi_2$ in the salicide process.

In other words, as a result of using the platinum-doped Ni alloy of the present invention and sputtering a film on a Si substrate, additionally heating this sputtered film in a nitrogen atmosphere, and measuring the temperature change of the crystal structure via XRD (X-ray diffraction), the phase change temperature increased by 50 to 100° C. by adding Pt in an amount of 5 to 30 at %, and one or more components selected from V, Al, Cr, Ti, Mo, and Si in an amount of 1 to 5 at %, and it was possible to confirm obvious thermal stability.

Specifically, when a Ni silicide film is formed via the salicide process, it was possible to achieve a phase change temperature from NiSi to $NiSi_2$ of 750° C. or higher, and even a phase change temperature from NiSi to $NiSi_2$ of 800° C. or higher.

In addition, in order to reduce the generation of particles during sputtering and achieve favorable uniformity, the amount of unavoidable impurities excluding gas components is preferably 100 wtppm or less, and more preferably 10 wtppm or less.

Since the gas components also cause the generation of particles, the amount of oxygen is preferably 50 wtppm or less and more preferably 10 wtppm or less, and the amount of nitrogen, hydrogen and carbon is preferably 10 wtppm or less, respectively.

As the sputtering characteristics, it is important that the initial magnetic permeability of the target is 50 or higher, preferably around 100, and the maximum magnetic permeability is 100 or higher.

Final heat treatment is performed at a recrystallization temperature (approximately 500° C.) or higher to 950° C. in order to obtain a substantially recrystallized structure. If the heat treatment temperature is less than 500° C., a sufficiently recrystallized structure cannot be obtained, and, in addition, improvement in the magnetic permeability and maximum magnetic permeability cannot be achieved.

While the characteristics of the target of the present invention are not affected by the existence of a certain degree of unrecrystallized crystals, the existence of a large quantity is undesirable. The average crystal grain size of the target is desirably 80 µm or less.

Final heat treatment performed at a temperature that is higher than 950° C. is undesirable since it will coarsen the average crystal grain size. When the average crystal grain size is coarsened, variation in the crystal grain size will increase and the uniformity will deteriorate.

EXAMPLES

The Examples and Comparative Examples of the present invention are now explained. Note that these Examples are only illustrative, and the present invention is not limited to these Examples. In other words, this invention covers all modes and modifications other than the Examples which are within the technical scope of the present invention.

Example 1

Crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 1 at % of V also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 100 to 110 H/m. By way of reference, the magnetic permeability of Ni is 250 H/m, and roughly 2.5 times greater than this Example.

Note that the measurement of the magnetic permeability was performed by uniformly measuring the target radially at 17 points and obtaining the average value thereof. The same measurement method was adopted for the following Examples and Comparative Examples.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ω/□ is Ohm per square hereinafter), normally around 30 to 60Ω/□, and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 1, similar results were obtained so as long as V was added in an amount of 1 to 5 at %.

Example 2

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 2 at % of Al also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 90 to 100 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ohm/sq), normally around 30 to 60Ω/□ (Ohm/sq), and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 2, similar results were obtained so as long as Al was added in an amount of 1 to 5 at %.

Example 3

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 3 at % of Cr also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 90 to 100 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ohm/sq), normally around 30 to 60Ω/□ (Ohm/sq), and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 3, similar results were obtained so as long as Cr was added in an amount of 1 to 5 at %.

Example 4

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 4 at % of Ti also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ohm/sq), normally around 30 to 60Ω/□ (Ohm/sq), and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 4, similar results were obtained so as long as Ti was added in an amount of 1 to 5 at %.

Example 5

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 5 at % of Mo also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 70 to 80 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ohm/sq), normally around 30 to 60Ω/□ (Ohm/sq), and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 5, similar results were obtained so as long as Mo was added in an amount of 1 to 5 at %.

Example 6

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 2.5 at % of Si also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/□ (Ohm/sq), normally around 30 to 60Ω/□ (Ohm/sq), and results that were not inferior in comparison to the case of only adding platinum were obtained. The fact that the sheet resistance value did not increase even when heat treatment was performed at a high temperature means that the phase change from NiSi to $NiSi_2$ did not occur.

In Example 6, similar results were obtained so as long as Si was added in an amount of 1 to 5 at %.

Example 7

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 1 at % of V and 1.5 at % of Al also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/☐ (Ohm/sq), normally around 30 to 60Ω/☐ (Ohm/sq), and results that were not inferior in comparison to the case of only adding platinum were obtained. The fact that the sheet resistance value did not increase even when heat treatment was performed at a high temperature means that the phase change from NiSi to NiSi2 did not occur.

In Example 7, similar results were obtained so as long as V and Al were added in a total amount of 1 to 5 at %.

Example 8

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 2 at % of Cr and 1.5 at % of Ti also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/☐ (Ohm/sq), normally around 30 to 60Ω/☐ (Ohm/sq), and results that were not inferior in comparison to the case of only adding platinum were obtained. The fact that the sheet resistance value did not increase even when heat treatment was performed at a high temperature means that the phase change from NiSi to NiSi$_2$ did not occur.

In Example 8, similar results were obtained so as long as Cr and Ti were added in a total amount of 1 to 5 at %.

Example 9

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 1.5 at % of Mo and 2 at % of Si also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/☐ (Ohm/sq), normally around 30 to 60Ω/☐ (Ohm/sq), and results that were not inferior in comparison to the case of only adding platinum were obtained. The fact that the sheet resistance value did not increase even when heat treatment was performed at a high temperature means that the phase change from NiSi to NiSi$_2$ did not occur.

In Example 9, similar results were obtained so as long as Mo and Si were added in a total amount of 1 to 5 at %.

Example 10

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 1.0 at % of V, 1.5 at % of Cr and 1 at % of Mo also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/☐ (Ohm/sq), normally around 30 to 60Ω/☐ (Ohm/sq), and results that were not inferior in comparison to the case of only adding platinum were obtained. The fact that the sheet resistance value did not increase even when heat treatment was performed at a high temperature means that the phase change from NiSi to NiSi2 did not occur.

In Example 10, similar results were obtained so as long as V and Cr and Mo were added in a total amount of 1 to 5 at %.

Example 11

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 1.5 at % of Al, 1.0 at % of Ti and 1.5 at % of Si also having the same level of purity were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 80 to 90 H/m. By way of reference, the magnetic permeability of Ni is 250 H/m, and roughly 3 times greater than this Example.

The Ni alloy target obtained as described above was sputtered on a silicon substrate using a magnetron sputtering device. The outline of the erosion profile upon sputtering this target up to a life of 100 kWh is shown in (2) of FIG. 1.

The erosion volume was ¼ in comparison to the original target, and it can be confirmed that the entire target is eroded in comparison to the Comparative Examples described later.

As with Example 1, as shown in (2) of FIG. 1, there was no significant difference in height of the erosion at the portion with a magnet and the portion without a magnet on the back side of the target, and the usability increased by that much. The time required for deposition up to 500 Å was 20 seconds. This means that, since the magnetic permeability was small, the sputter rate increased and a deposition time of 20 seconds was thereby achieved. And the number of films that could be processed per unit time increased in accordance with the increase of throughput efficiency.

In addition, the sputtered film was heated in a nitrogen atmosphere and the temperature change of the sheet resistance value was measured. At a heat treatment temperature of 400 to 850° C., the increase of the sheet resistance value could hardly be acknowledged and was less than 70Ω/☐ (Ohm/sq), normally around 30 to 60Ω/☐ (Ohm/sq), and results that were not inferior in comparison to the case of only adding platinum were obtained. The fact that the sheet resistance value did not increase even when heat treatment was performed at a high temperature means that the phase change from NiSi to NiSi$_2$ did not occur.

In Example 11, similar results were obtained so as long as Al and Ti and Si were added in a total amount of 1 to 5 at %.

Comparative Example 1

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

10 at % of high purity platinum having the same level of purity as the obtained ingot was added. No accessory components were added. Subsequently, the product was subject to vacuum melting so as to prepare a high purity Ni alloy ingot.

Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 140 H/m. By way of reference, the magnetic permeability of Ni is 250 H/m, and roughly 1.5 times greater than this Example.

The Ni alloy target obtained as described above was sputtered on a silicon substrate using a magnetron sputtering device. The outline of the erosion profile upon sputtering this target up to a life of 100 kWh is shown in (1) of FIG. 1.

The erosion volume was ⅕ in comparison to the original target, and the deep portion of the erosion was eroded in a donut shape having a triangular cross section.

As shown in (1) of FIG. 1, there was significant difference in height of the erosion between the portion with a magnet and the portion without a magnet on the back side of the target, and this was clearly different from the Examples. Hence, the usability decreased by that much. The time required for deposition up to 500 Å was 30 seconds. This means that, since the magnetic permeability was large, the sputter rate decreased and the deposition time increased to 30 seconds. And the number of films that could be process per unit time decreased since the throughput efficiency decreased.

In addition, the sputtered film was heated in a nitrogen atmosphere and the temperature change of the sheet resistance value was measured. At a heat treatment temperature of 400 to 850° C., the increase of the sheet resistance value was acknowledged, and the results were inferior in the case of only adding platinum. The fact that the sheet resistance value increased even when heat treatment was performed at a high temperature means that the phase change from NiSi to $NiSi_2$ occurred. In Comparative Example 1, only platinum was added, and in this case the results were inferior in comparison to the Examples.

Comparative Example 2

As with Example 1, crude Ni (up to roughly 4N) was subject to electrolytic refining to eliminate the metal impurity components, and EB melting and refining were additionally performed thereto so as to obtain a high purity nickel ingot (99.999 wt %).

As the additive elements, 10 at % of high purity platinum having the same level of purity as the obtained ingot, and 10 at % of Al also having the same level of purity were added. Subsequently, the product was subject to vacuum melting so as to prepare a high purity Ni alloy ingot. Upon subjecting the foregoing material to vacuum melting, a cold crucible melting method using a water-cooled copper crucible was adopted.

The alloy ingot obtained by melting and casting was formed into a plate-like shape via forging and rolling, ultimately subject to heat treatment at 500 to 950° C., and thereafter machined to prepare a target. However, since the content of the accessory component Al was great at 10 at %, intermetallic compounds were formed and the material cracked during the processing, and it was not possible to prepare a target. Consequently, the target could not be evaluated.

Even if a cracked target could be prepared, the existence of cracks and intermetallic compounds in the target will cause the considerable generation of particles, and it is considered that this would be completely incompatible as a target.

In Comparative Example 2, Al was independently added in an amount of 10 at %, but also in cases where one component (excluding Al which would be overlapping) selected from V, Al, Cr, Ti, Mo, and Si or a combination of these accessory components is added in a total amount of 10 at %, similar results were obtained as the foregoing case of independently adding Al in an amount of 10 at %.

Comparative Example 3

As with Example 1, crude Ni (up to roughly 4N) was subject to electrolytic refining to eliminate the metal impurity components, and EB melting and refining were additionally performed thereto so as to obtain a high purity nickel ingot (99.999 wt %). 8 at % (22 wt %) of high purity platinum having the same level of purity as the ingot, as well as 5 wtppm of high purity iridium, 5 wtppm of high purity ruthenium, and 5 wtppm of high purity palladium were added. Note that, in the foregoing case, the total amount of iridium, ruthenium, and palladium was 15 wtppm.

Subsequently, the product was subject to vacuum melting so as to prepare a high purity Ni alloy ingot. Upon subjecting the foregoing material to vacuum melting, a cold crucible melting method using a water-cooled copper crucible was adopted. The plastic workability to obtain a target was favorable and there were no particular problems.

The alloy ingot obtained by melting and casting was formed into a plate-like shape via forging and rolling, ultimately subject to heat treatment at 500 to 950° C., and thereafter machined to prepare a target. The size of this target was 440 mm (diameter)×3 mmt (thickness). The magnetic permeability of the target was 140 H/m. By way of reference, the magnetic permeability of Ni is 250 H/m, and roughly 1.5 times greater than this Example.

The Ni alloy target obtained as described above was sputtered on a silicon substrate using a magnetron sputtering device. The outline of the erosion profile upon sputtering this target up to a life of 100 kWh is shown in (1) of FIG. 1. The erosion volume was ⅕ in comparison to the original target, and the deep portion of the erosion was eroded in a donut shape having a triangular cross section.

As shown in (1) of FIG. 1, there was significant difference in height of the erosion at the portion with a magnet and the portion without a magnet on the back side of the target, and this was clearly different from the Examples. Hence, the usability decreased by that much. The time required for deposition up to 500 Å was 30 seconds. This means that, since the magnetic permeability was large, the sputter rate decreased and the deposition time increased to 30 seconds. And the number of films that could be process per unit time decreased since the throughput efficiency decreased.

In addition, the sputtered film was heated in a nitrogen atmosphere and the temperature change of the sheet resistance value was measured. At a heat treatment temperature of 400 to 850° C., the increase of the sheet resistance value was hardly acknowledged. However, a problem arose in that significant difference in height of the erosion at the portion with a magnet and the portion without a magnet on the back side of the target as described above, and the results were inferior.

INDUSTRIAL APPLICABILITY

As described above, as a result of adding the foregoing metal elements, together with platinum, to high purity nickel, thermally stable silicide (NiSi) deposition is enabled, and the effects of being able to reduce the generation of particles during sputtering and achieving favorable uniformity are yielded. Moreover, as a result of reducing the addition of expensive platinum to the minimum in cases of using platinum-doped Ni alloy (Ni—Pt alloy) and insistently maintaining the characteristics of a Ni—Pt alloy, reducing the magnetic permeability, and increasing the pass-through flux (PTF), significant effects are yielded in that it is possible to inhibit the magnetic field lines from becoming locally concentrated on the surface of the target during sputtering, and increase the erosion area of the target as much as possible.

Consequently, the target of the present invention yields of effects of being able to reduce the difference to the minimum between the portion where erosion is selectively advanced and the portion where erosion does not advance as much as the erosion progresses so as to reduce the variation in the thickness of the target, and consequently prolong the target life and increase the usability. Moreover, since it is possible to prevent the changes in the shape of the eroded portion from becoming remarkable, an effect is yielded in that the uniformity of the sputtered film is improved. The present invention comprehensively yields the foregoing results, and additionally yields a significant effect of being able to obtain a Ni silicide film capable of inhibiting the phase change from NiSi to $NiSi_2$ due to the deposition using the foregoing target.

Thus, the present invention is able to provide a Ni alloy sputtering target that is particularly effective for the manufacture of a gate electrode material (thin film).

The invention claimed is:

1. A Ni alloy sputtering target having a composition consisting of Pt in an amount of 5 to 30 at %, one or more elements selected from the group consisting of V, Al, Cr, Ti, Mo, and Si in a total amount of 1 to 5 at %, Ni, and unavoidable impurities.

2. The Ni alloy sputtering target according to claim 1, wherein the amount of Pt in the composition is 10 to 30 at %.

3. The Ni alloy sputtering target according to claim 1, wherein the one or more elements selected from the group consisting of V, Al, Cr, Ti, Mo, and Si exist in a solutionized state in the Ni alloy sputtering target.

4. A Ni alloy film of a composition consisting of Pt in an amount of 5 to 30 at %, one or more elements selected from the group consisting of V, Al, Cr, Ti, Mo, and Si in a total amount of 1 to 5 at %, Ni, and unavoidable impurities, wherein the Ni alloy film is deposited by a sputtering method.

5. The Ni alloy film according to claim 4, wherein the one or more elements selected from the group consisting of V, Al, Cr, Ti, Mo, and Si exist in a solutionized state in the Ni alloy film.

6. A Ni silicide film for use as a gate electrode and formed by sputter-depositing a Ni alloy film on a Si substrate and heating the Ni alloy film to make the Ni alloy film react with the Si substrate via a salicide process to form the Ni silicide film, wherein the Ni alloy film before the heating is of a composition consisting of Pt in an amount of 5 to 30 at %, one or more elements selected from the group consisting of V, Al, Cr, Ti, Mo, and Si in a total amount of 1 to 5 at %, Ni, and unavoidable impurities, wherein a phase change from NiSi to $NiSi_2$ in the Ni silicide film is inhibited and takes place only when the Ni silicide film is heated to a temperature of 750° C. or higher, and wherein said Ni silicide film is of a composition containing Ni, Pt, Si and one or more elements selected from the group consisting of V, Al, Cr, Ti and Mo.

7. The Ni silicide film according to claim 6, wherein the amount of Pt in the Ni silicide film is within a range of greater than 5 at % to less than 20 at %.

* * * * *